(12) United States Patent
Kasugai et al.

(10) Patent No.: US 8,189,637 B2
(45) Date of Patent: May 29, 2012

(54) SEMICONDUCTOR LIGHT-EMITTING DEVICE AND METHOD FOR MANUFACTURING THE SAME

(75) Inventors: Hideki Kasugai, Shiga (JP); Norio Ikedo, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/099,770

(22) Filed: May 3, 2011

(65) Prior Publication Data

US 2011/0206081 A1 Aug. 25, 2011

Related U.S. Application Data

(63) Continuation of application No. PCT/JP2010/005507, filed on Sep. 8, 2010.

(30) Foreign Application Priority Data

Feb. 17, 2010 (JP) ................................ 2010-032400

(51) Int. Cl.
*H01S 5/00* (2006.01)
*H01S 5/323* (2006.01)
*H01L 21/20* (2006.01)

(52) U.S. Cl. .......... 372/43.01; 372/46.014; 257/E21.09; 438/46

(58) Field of Classification Search ............... 372/43.01, 372/46.014; 257/E21.09; 438/46
See application file for complete search history.

(56) References Cited

U.S. PATENT DOCUMENTS

2010/0150194 A1 6/2010 Tsuchiya et al.

FOREIGN PATENT DOCUMENTS

| JP | 2003-289156 | * 10/2003 |
| JP | 2007-200933 | 9/2007 |
| JP | 2009-054616 | 3/2009 |
| JP | 2010-141242 | 6/2010 |

OTHER PUBLICATIONS

W. Liu, et al., "Effect of high temperature and interface treatments on photoluminescence from InGaN/GaN multiple quantum wells with green light emission", Applied Physics Letters, vol. 83 No. 5, 2003, American Institute of Physics.
Yong-Tae Moon, et al., "Effects of thermal and hydrogen treatment on indium segregation in InGaN/GaN multiple quantum wells", Journal of Applied Physics, vol. 89, No. 11, 2001, American Institute of Physics.

* cited by examiner

*Primary Examiner* — Armando Rodriguez
(74) *Attorney, Agent, or Firm* — McDermott Will & Emery LLP (57) ABSTRACT

A semiconductor light-emitting device includes an n-type cladding layer formed on a substrate, an active layer formed on the n-type cladding layer and including a well layer and a barrier layer, and a p-type cladding layer formed on the active layer. The well layer is made of an indium-containing nitride semiconductor, and has a hydrogen concentration greater than that of the n-type cladding layer and less than that of the p-type cladding layer.

16 Claims, 9 Drawing Sheets

SEMICONDUCTOR LIGHT-EMITTING DEVICE AND METHOD FOR MANUFACTURING THE SAME

CROSS-REFERENCE TO RELATED APPLICATION

This is a continuation of PCT International Application PCT/JP2010/005507 filed on Sep. 8, 2010, which claims priority to Japanese Patent Application No. 2010-032400 filed on Feb. 17, 2010. The disclosures of these applications including the specifications, the drawings, and the claims are hereby incorporated by reference in its entirety.

BACKGROUND

The present disclosure relates to a semiconductor light-emitting device and a method for manufacturing the same, and more particularly to a semiconductor laser device using a nitride semiconductor and a method for manufacturing the same.

A III-V group nitride compound semiconductor such as gallium nitride (GaN), so-called a "nitride semiconductor", has been drawing public attention. The general formula of nitride semiconductors can be expressed as $In_xGa_yAl_{1-x-y}N$ ($0 \leq x \leq 1$, $0 \leq y \leq 1$, $x+y \leq 1$). A nitride semiconductor is a compound semiconductor containing aluminum (Al), gallium (Ga) and indium (In) which are III-group elements and nitrogen (N) which is a V-group element. In the field of optical devices, light-emitting diodes (LEDs) using nitride semiconductors have been used as elements of large-size display devices, traffic lights, etc. While some white LEDs employing a combination of LEDs using nitride semiconductors and phosphors have been commercialized and, if the light-emitting efficiency is improved, are expected to replace existing lighting devices.

On the other hand, semiconductor laser devices in the blue-violet to pure-green region using nitride semiconductors have also been very actively researched and developed. With a blue-violet semiconductor laser device, the spot diameter on an optical disc can be reduced as compared with semiconductor laser devices emitting light in the red or infrared range used in conventional optical discs such as compact discs (CDs) and digital versatile discs (DVDs), and it is therefore possible to improve the recording density of an optical disc. Pure-blue laser devices whose light-emitting wavelength is 450 nm to 470 nm and pure-green laser devices whose light-emitting wavelength is 525 nm to 535 nm can be used in backlight applications for laser displays and LCDs. By using these, it is possible to realize displays having very high color reproducibility as compared with conventional displays.

Particularly, pure-blue and pure-green laser devices, among these nitride semiconductor laser devices, have a very high oscillation threshold current, and are therefore yet to be commercialized. Generally, in order to obtain a nitride semiconductor laser device whose light-emitting wavelength is 430 nm or more, it is necessary to increase the indium content of the well layer in the active layer having a quantum well structure. This is because it is necessary for increasing the light-emitting wavelength to increase the indium content of the well layer and to reduce the energy band gap of the well layer. For crystal growth of a well layer having a high indium content, it is necessary to increase the concentration of the indium material in the gas phase. However, if the indium concentration in the gas phase is increased during crystal growth, indium which is not taken into the well layer segregates on the surface of the well layer. Regions where indium segregates on the surface become non-light-emitting regions, thereby significantly lowering the light-emitting efficiency of the active layer. In a well layer with a high indium content, indium content non-uniformity is also likely to occur in addition to the indium segregation. This results in a large photoluminescence half width. As the photoluminescence half width is larger, it is more difficult to obtain a gain to reach laser oscillation.

Methods have been studied in which in order to suppress the indium segregation in the well layer, the growth is once discontinued after the crystal growth of the well layer, and a carrier gas containing an ammonia gas, a nitrogen gas and a hydrogen gas is supplied to remove segregated indium (see, for example, Japanese Laid-Open Patent Publication No. 2009-054616).

SUMMARY

However, the present inventors have found that it is not possible to sufficiently suppress the indium segregation in the well layer with the conventional method for suppressing the indium segregation. It is also difficult to suppress the indium content non-uniformity. Moreover, the present inventors have also found that since it is necessary to increase the proportion of hydrogen supplied as the carrier gas, the surface morphology deteriorates due to the hydrogen etching effect. Thus, with the conventional method for suppressing the indium segregation, it is difficult to suppress the increase in the threshold current density and to suppress the increase in the photoluminescence half width in the semiconductor laser device. Similar problems occur in other semiconductor light-emitting devices such as light-emitting diodes, as well as in semiconductor laser devices.

An object of the present disclosure is to realize a nitride semiconductor light-emitting device having a low threshold current density by suppressing indium segregation and indium content non-uniformity in the active layer.

In order to achieve the object set forth above, the present disclosure provides a semiconductor light-emitting device in which an indium-containing well layer contains hydrogen at a concentration greater than that of an n-type cladding layer and less than that of a p-type cladding layer.

Specifically, an example semiconductor light-emitting device includes: an n-type cladding layer formed on a substrate; an active layer formed on the n-type cladding layer and including a well layer and a barrier layer; and a p-type cladding layer formed on the active layer, wherein the well layer is made of an indium-containing nitride semiconductor, and has a hydrogen concentration greater than that of the n-type cladding layer and less than that of the p-type cladding layer.

In the example semiconductor light-emitting device, the well layer is an indium (In)-containing nitride semiconductor and has a hydrogen concentration greater than that of the n-type cladding layer and less than that of the p-type cladding layer. Therefore, it is possible to exert the effect of suppressing indium segregation by hydrogen while suppressing the effect of deteriorating the surface morphology by hydrogen. Therefore, it is possible to realize a semiconductor light-emitting device having a low threshold current density. Moreover, it is possible to suppress the increase in the photoluminescence half width, thus making it easier to reach laser oscillation.

In the example semiconductor light-emitting device, the hydrogen concentration of the well layer may be greater than twice and less than approximately 10 times the hydrogen concentration of the n-type cladding layer and is greater than approximately 0.07 time and less than approximately 0.35 time the hydrogen concentration of the p-type cladding layer.

In the example semiconductor light-emitting device, the hydrogen concentration of the well layer may be greater than approximately $7\times10^{17}$ cm$^{-3}$ and less than approximately $3\times10^{18}$ cm$^{-3}$.

In the example semiconductor light-emitting device, the well layer and the barrier layer may have an equal hydrogen concentration.

In the example semiconductor light-emitting device, the well layer may be made of a compound whose general formula is expressed as $In_xGa_{1-x}N$ (where 0<x<1).

In the example semiconductor light-emitting device, an indium content ratio of the well layer may be approximately 0.1 or more.

In the example semiconductor light-emitting device, it is preferred that an indium segregation density of the active layer is approximately $1\times10^6$ cm$^{-2}$ or less.

In the example semiconductor light-emitting device, it is preferred that a photoluminescence half width of the active layer is approximately 120 meV or less.

An example method for manufacturing a semiconductor light-emitting device includes the steps of: (a) growing an n-type cladding layer on a substrate; (b) after the step (a), growing an active layer using a hydrogen-containing carrier gas; and (c) after the step (b), growing a p-type cladding layer, wherein the active layer includes a well layer and a barrier layer, and the well layer is made of an indium-containing nitride semiconductor, and has a hydrogen concentration greater than that of the n-type cladding layer and less than that of the p-type cladding layer.

The example method for manufacturing a semiconductor light-emitting device includes a step of growing an active layer using a hydrogen-containing carrier gas. Therefore, it is possible to suppress indium segregation in the active layer. The well layer has a hydrogen concentration greater than that of the n-type cladding layer and less than that of the p-type cladding layer. Therefore, it is possible to suppress deterioration of the surface morphology by the hydrogen etching effect, and it is possible to realize a method for manufacturing a semiconductor light-emitting device with which an increase in the photoluminescence half width and an increase in the threshold current density are unlikely.

In the example method for manufacturing a semiconductor light-emitting device, the step (b) may be performed so that the hydrogen concentration of the well layer is greater than twice and less than approximately 10 times the hydrogen concentration of the n-type cladding layer and is greater than approximately 0.07 time and less than approximately 0.35 time the hydrogen concentration of the p-type cladding layer.

In the example method for manufacturing a semiconductor light-emitting device, the step (b) may be performed so that the hydrogen concentration of the well layer is greater than approximately $7\times10^{17}$ cm$^{-3}$ and less than approximately $3\times10^{18}$ cm$^{-3}$.

In the example method for manufacturing a semiconductor light-emitting device, the step (b) may be performed so that the hydrogen concentration of the well layer and the hydrogen concentration of the barrier layer are equal to each other.

In the example method for manufacturing a semiconductor light-emitting device, the well layer may be made of a compound whose general formula is expressed as $In_xGa_{1-x}N$ (where 0<x<1).

In the example method for manufacturing a semiconductor light-emitting device, an indium content ratio of the well layer may be approximately 0.1 or more.

In the example method for manufacturing a semiconductor light-emitting device, it is preferred that an indium segregation density of the active layer is approximately $1\times10^6$ cm$^{-2}$ or less.

In the example method for manufacturing a semiconductor light-emitting device, it is preferred that a photoluminescence half width of the active layer is approximately 120 meV or less.

BRIEF DESCRIPTION OF THE DRAWINGS

FIGS. 1A and 1B show a principle of suppressing indium segregation, wherein

DETAILED DESCRIPTION

Figure 1:
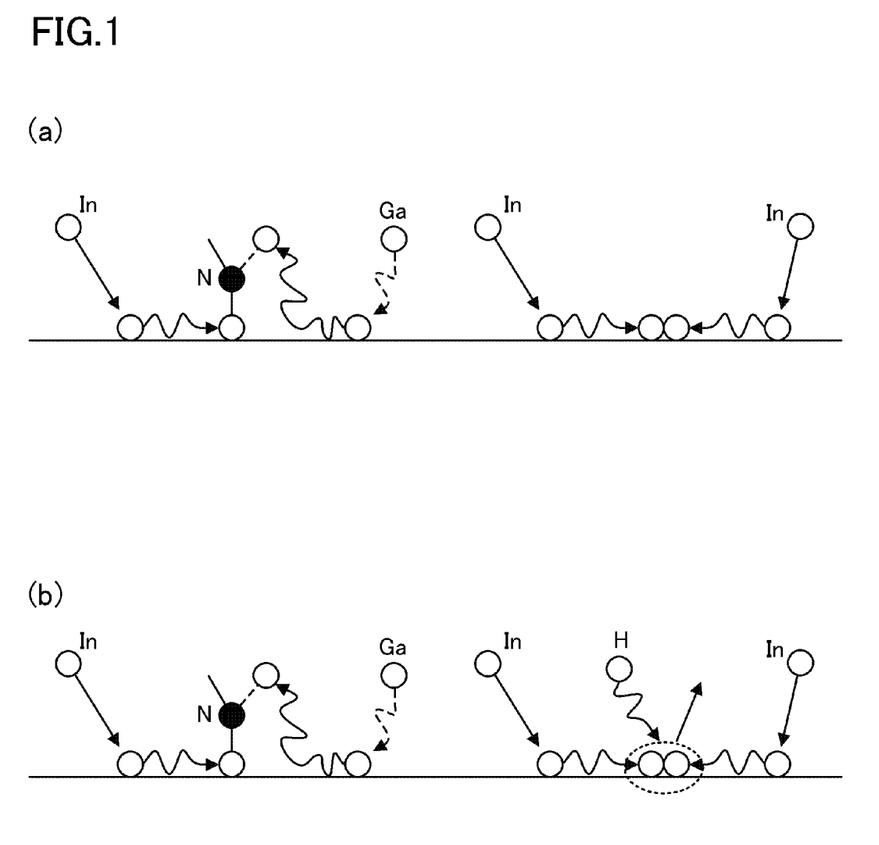
FIG. 1A shows crystal growth of InGaN where the carrier gas is nitrogen.
FIG. 1B shows crystal growth of InGaN where the carrier gas is a mixed gas of nitrogen and hydrogen.

First, the principle of suppressing indium segregation in the present embodiment will be described. FIGS. 1A and 1B show the growth of InGaN. FIG. 1A is a case where the carrier gas is nitrogen ($N_2$), and FIG. 1B is a case where the carrier gas is a mixed gas of nitrogen ($N_2$) and hydrogen ($H_2$). As shown in FIG. 1A, with a carrier gas only of nitrogen to which hydrogen is not added, if InGaN is grown with a large amount of indium supply, there is not only normal growth of InGaN but also indium segregation as part of an excess of indium binds together. On the other hand, where hydrogen is added to the carrier gas, the bond once made between indium is resolved by the hydrogen etching effect. Therefore, it is possible to suppress indium segregation. It is preferred that the amount of hydrogen added is 0.5% or less with respect to the amount of carrier gas flow.

Figure 2:
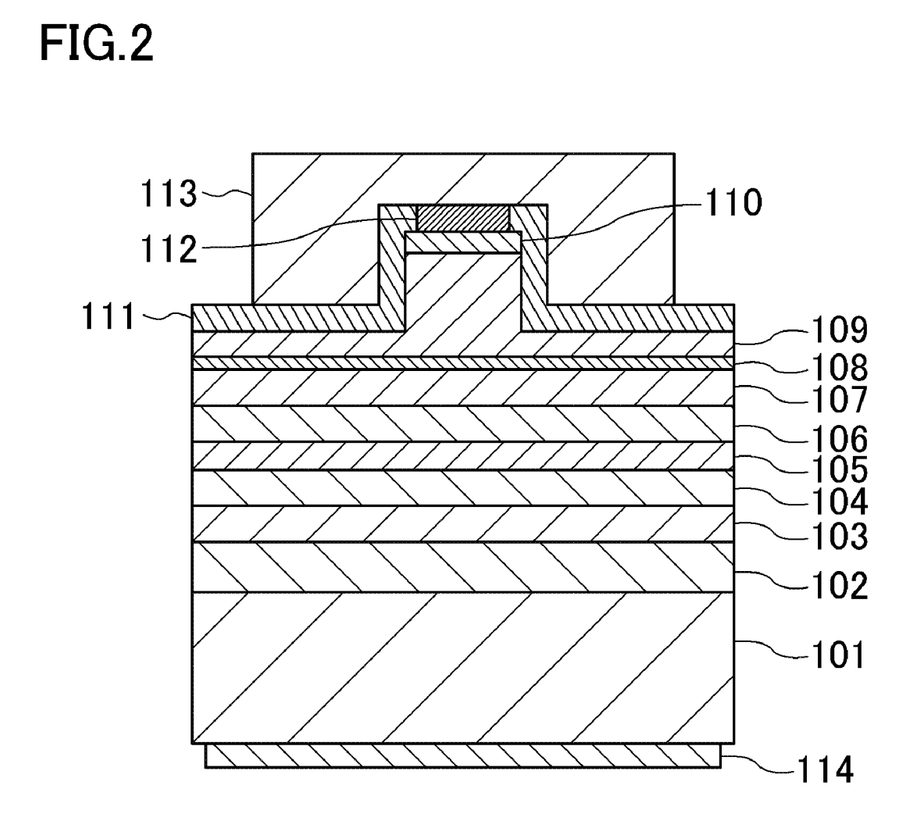
FIG. 2 is a cross-sectional view showing a nitride semiconductor light-emitting device according to one embodiment.

FIG. 2 shows a cross-sectional structure of a semiconductor light-emitting device according to one embodiment. As shown in FIG. 2, the semiconductor light-emitting device of the present embodiment is a semiconductor laser device (laser diode). An n-type cladding layer 102, a first n-type guide layer 103, a second n-type guide layer 104, an active layer 105, a first p-type guide layer 106, a second p-type guide layer 107, an electron barrier layer 108, a p-type cladding layer 109 and a contact layer 110 are formed in this order on the (0001) plane of a substrate 101 made of n-GaN.

Figure 3:
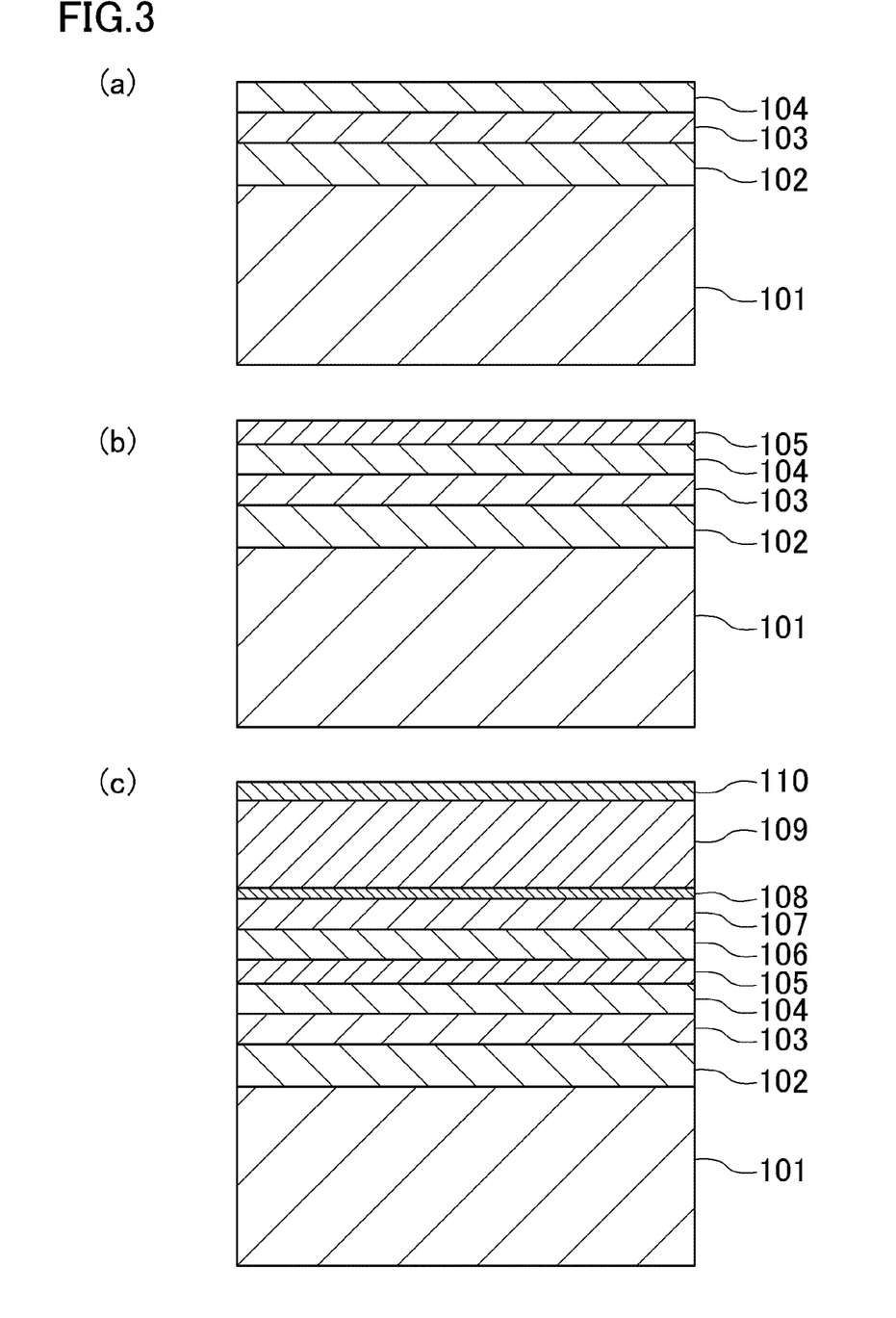
FIGS. 3A to 3C are cross-sectional views showing, step by step, a method for manufacturing a nitride semiconductor light-emitting device according to one embodiment.

The layers may be formed as follows, for example. First, as shown in FIG. 3A, the n-type cladding layer 102, the first n-type guide layer 103 and the second n-type guide layer 104 are grown in this order on the substrate 101 using a metal organic chemical vapor deposition (MOCVD) method. The n-type cladding layer 102 may be n-$Al_{0.05}Ga_{0.95}N$, the first n-type guide layer 103 may be n-GaN, and the second n-type guide layer 104 may be n-$In_{0.02}Ga_{0.98}N$.

Then, as shown in FIG. 3B, the active layer 105 having a quantum well structure is formed. The active layer 105 is obtained by growing $In_{0.15}Ga_{0.85}N$ as the well layer and $In_{0.03}Ga_{0.97}N$ as the barrier layer over three cycles. While the well layer may be of any indium-containing compound whose general formula is expressed as $In_xGa_{(1-x)}N$ ($0 \leq x < 1$), the indium content x is preferably 0.1 or more in order to obtain a semiconductor laser device having a wavelength of 430 nm or more. The barrier layer may be of any compound whose general formula is expressed as $In_yGa_{(1-y)}N$ ($0 \leq y < x$). When forming the active layer 105, a slight amount of hydrogen is added to the carrier gas. The amount of hydrogen added is preferably 0.5% or less with respect to the amount of carrier gas flow. In the present embodiment, the concentration of hydrogen contained in the active layer 105 was greater than $7 \times 10^{17}$ cm$^{-3}$ and less than $3.5 \times 10^{18}$ cm$^{-3}$. In the present embodiment, hydrogen was added to the carrier gas also when forming the barrier layer. However, where the barrier layer does not contain indium, hydrogen does not need to be added when forming the barrier layer.

Then, as shown in FIG. 3C, the first p-type guide layer 106 made of p-$In_{0.02}Ga_{0.98}N$, the second p-type guide layer 107 made of p-GaN, the electron barrier layer 108 made of p-$Al_{0.22}Ga_{0.78}N$, the p-type cladding layer 109 in which p-$Al_{0.1}Ga_{0.9}N$ and GaN are layered alternately, and the contact layer 110 made of p-GaN are formed in this order.

Figure 4:
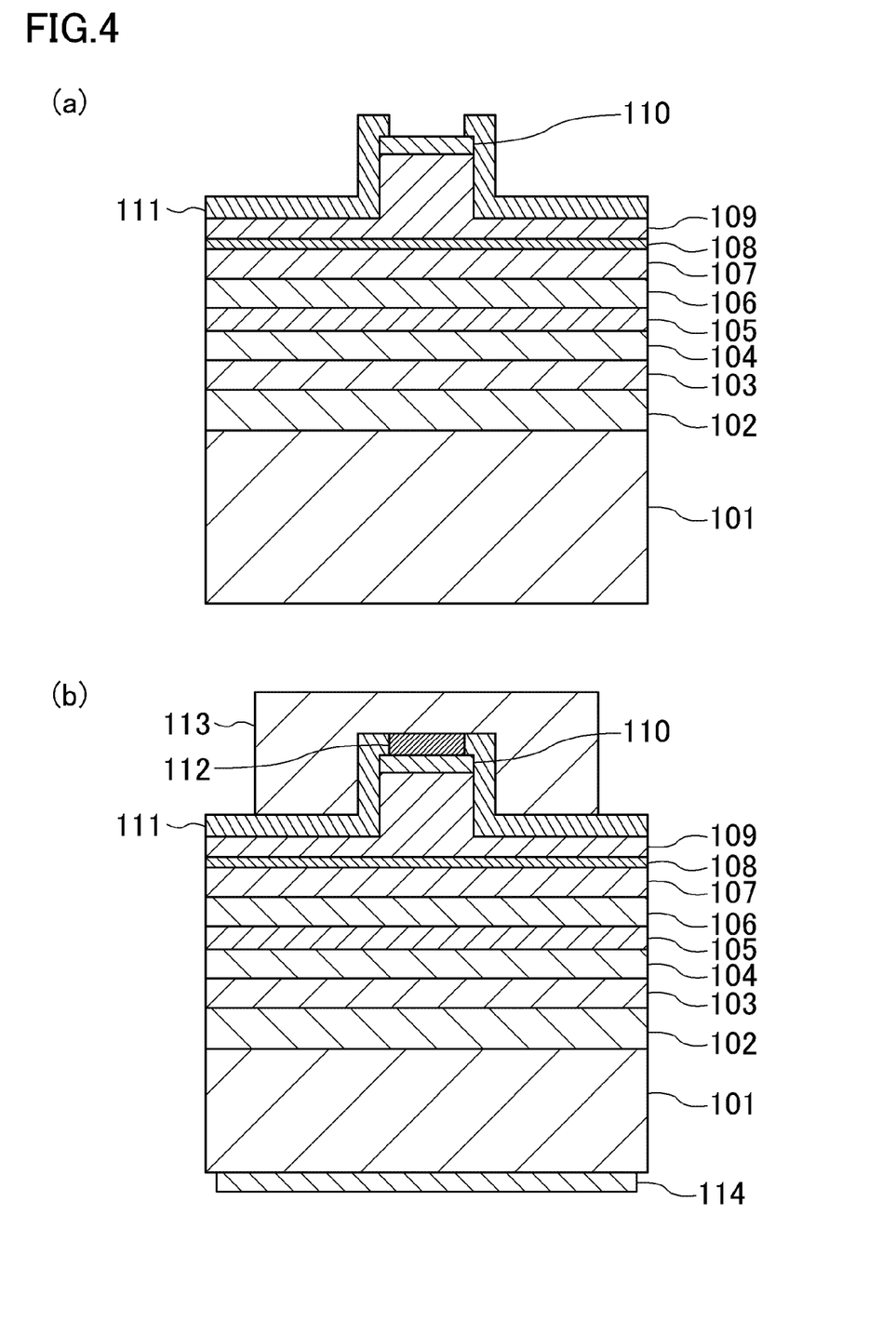
FIGS. 4A and 4B are cross-sectional views showing, step by step, a method for manufacturing a nitride semiconductor light-emitting device according to one embodiment.
Figure 5:
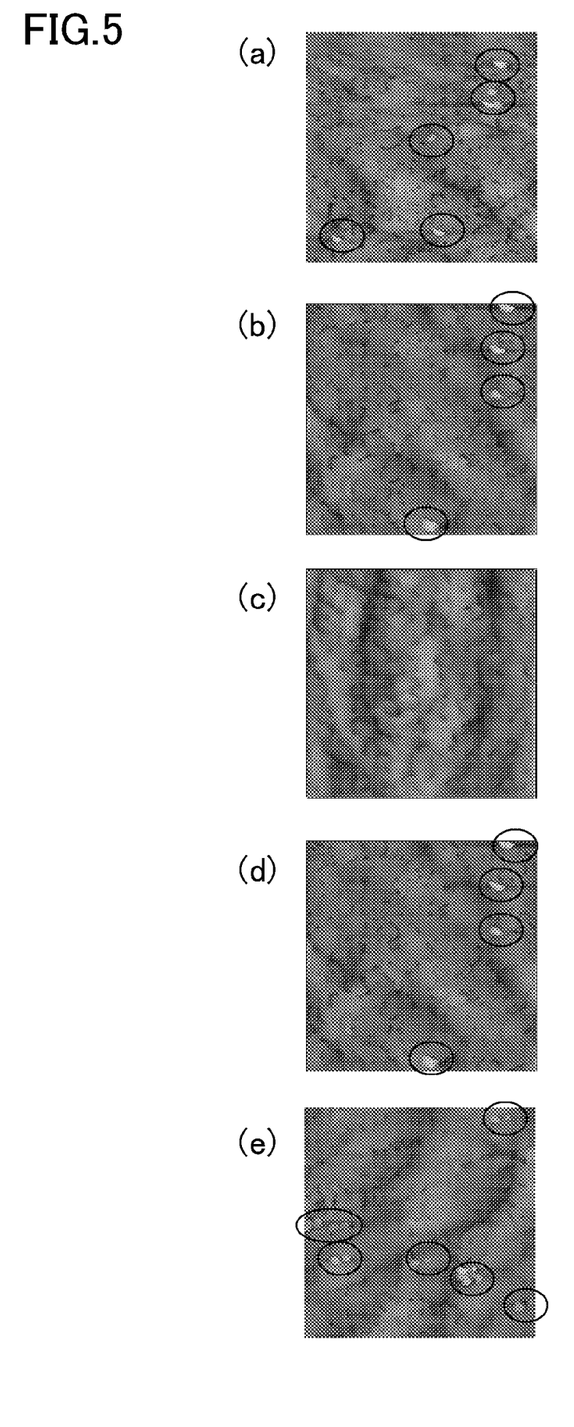
FIGS. 5A to 5E are atomic force microscope images of InGaN layers manufactured under different conditions.

Then, as shown in FIG. 4A, a ridge stripe portion having a width of about 1.5 μm is formed, and then an insulating film 111 is formed. The ridge stripe portion can be formed as follows. First, an $SiO_2$ film having a thickness of 300 nm is formed on the contact layer 110 using a plasma chemical vapor deposition method (CVD method). Then, the $SiO_2$ film is selectively removed by photolithography and etching using hydrogen fluoride, thereby forming a stripe-patterned etching mask having a width of 1.5 μm. Then, portions not covered by the etching mask are removed to a depth of about 0.35 μm by inductively coupled plasma (ICP) dry etching using a chlorine ($Cl_2$) gas.

The insulating film 111 may be an $SiO_2$ film having a thickness of about 300 nm. After removing the etching mask, an $SiO_2$ film is formed by a plasma CVD method so as to cover the entire surface of the substrate 101. Then, the $SiO_2$ film is selectively removed so that the upper surface of the contact layer 110 is exposed by photolithography and dry etching.

Then, as shown in FIG. 4B, a p-type electrode 112, a wiring electrode (not shown), a pad electrode 113 and an n-type electrode 114 are formed. The p-type electrode 112 may be a palladium film having a thickness of about 35 nm and a platinum film having a thickness of about 40 nm formed by an electron beam (EB) vapor deposition method, or the like. The wiring electrode may be a layered structure including a titanium film having a thickness of 50 nm, a platinum film having a thickness of 200 nm and a titanium film having a thickness of 50 nm, and may have a width of about 20 μm in the direction parallel to the cleavage plane. The pad electrode 113 can be obtained by forming a titanium film having a thickness of 50 nm and a gold film having a thickness of 1000 nm so that the length in the resonator direction is about 550 μm and the width in the direction parallel to the cleavage plane is about 150 μm, and then thickening the gold film to about 10 μm by electroplating. The n-type electrode 114 can be obtained by thinning the substrate 101 to about 100 μm by diamond slurry, and then forming a titanium film having a thickness of 5 nm, a platinum film having a thickness of 10 nm and a gold film having a thickness of 1000 nm on the reverse surface of the substrate 101 using an EB vapor deposition method, or the like. Then, chips are separated by cleaving.

FIGS. 5A to 5E show results of observing the surfaces of the active layers 105 formed under various conditions with an atomic force microscope (AFM). FIGS. 5A to 5E show cases where the hydrogen concentration of the active layer 105 is $7 \times 10^{17}$ cm$^{-3}$, $1 \times 10^{18}$ cm$^{-3}$, $2 \times 10^{18}$ cm$^{-3}$, $3 \times 10^{18}$ cm$^{-3}$, and $3.5 \times 10^{18}$ cm$^{-3}$, respectively. Circles in FIGS. 5A to 5E denote areas with segregation. Table 1 shows the relationship between the concentration of hydrogen contained in the active layer 105 and the indium segregation density calculated from the AFM image. As the concentration of hydrogen contained in the active layer 105 increases, the abnormal growth by indium segregation decreases. When the hydrogen concentration was $2 \times 10^{18}$ cm$^{-3}$, the indium segregation density was $1 \times 10^6$ cm$^{-2}$ or less, and substantially no abnormal growth was observed. However, when the hydrogen concentration exceeded $2 \times 10^{18}$ cm$^{-3}$, abnormal growth due to indium segregation increased.

TABLE 1

| Hydrogen Concentration | $7 \times 10^{17}$ cm$^{-3}$ | $1 \times 10^{17}$ cm$^{-3}$ | $2 \times 10^{17}$ cm$^{-3}$ | $3 \times 10^{17}$ cm$^{-3}$ | $3.5 \times 10^{17}$ cm$^{-3}$ |
|---|---|---|---|---|---|
| In Segregation Density | $3.6 \times 10^7$ cm$^{-2}$ | $2.0 \times 10^7$ cm$^{-2}$ | $<1.0 \times 10^6$ cm$^{-2}$ | $2.0 \times 10^7$ cm$^{-2}$ | $6.8 \times 10^7$ cm$^{-2}$ |

Figure 6:
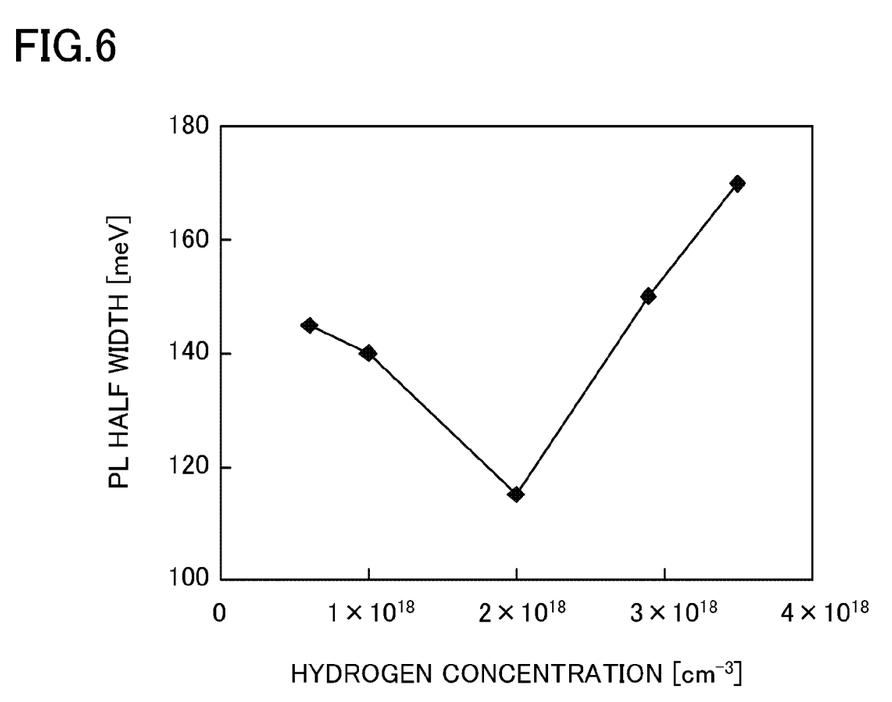
FIG. 6 is a graph showing the relationship between the hydrogen concentration in the quantum well active layer and the photoluminescence half width.

FIG. 6 shows the relationship between the hydrogen concentration in the active layer 105 and the photoluminescence half width (PL half width). As the concentration of hydrogen contained in the active layer 105 increases, the PL half width decreases. When the hydrogen concentration was $2 \times 10^{18}$ cm$^{-3}$, the PL half width was about 115 meV. However, the PL half width increased when the hydrogen concentration further increased.

It is preferred that the PL half width of a semiconductor laser device is smaller than about 150 meV. Therefore, it is preferred that the hydrogen concentration in the active layer 105 is greater than $7 \times 10^{17}$ cm$^{-3}$ and less than $3 \times 10^{18}$ cm$^{-3}$. Particularly, by setting the hydrogen concentration in the active layer 105 to be $1.8 \times 10^{18}$ cm$^{-3}$ or more and $2.2 \times 10^{18}$ cm$^{-3}$ or less, it is possible to have a PL half width of about 120 meV or less even with a semiconductor laser device having a light-emitting wavelength of 430 nm or more. Blue-violet laser diodes having wavelengths of about 400 nm to about 410 nm which are currently mass-produced have PL half widths of about 110 meV to about 120 meV. Therefore, in such a case, it is possible to realize substantially equivalent characteristics to those of a blue-violet laser diode even with a pure-blue laser diode, or the like, having a wavelength of 430 nm or more.

Figure 7:
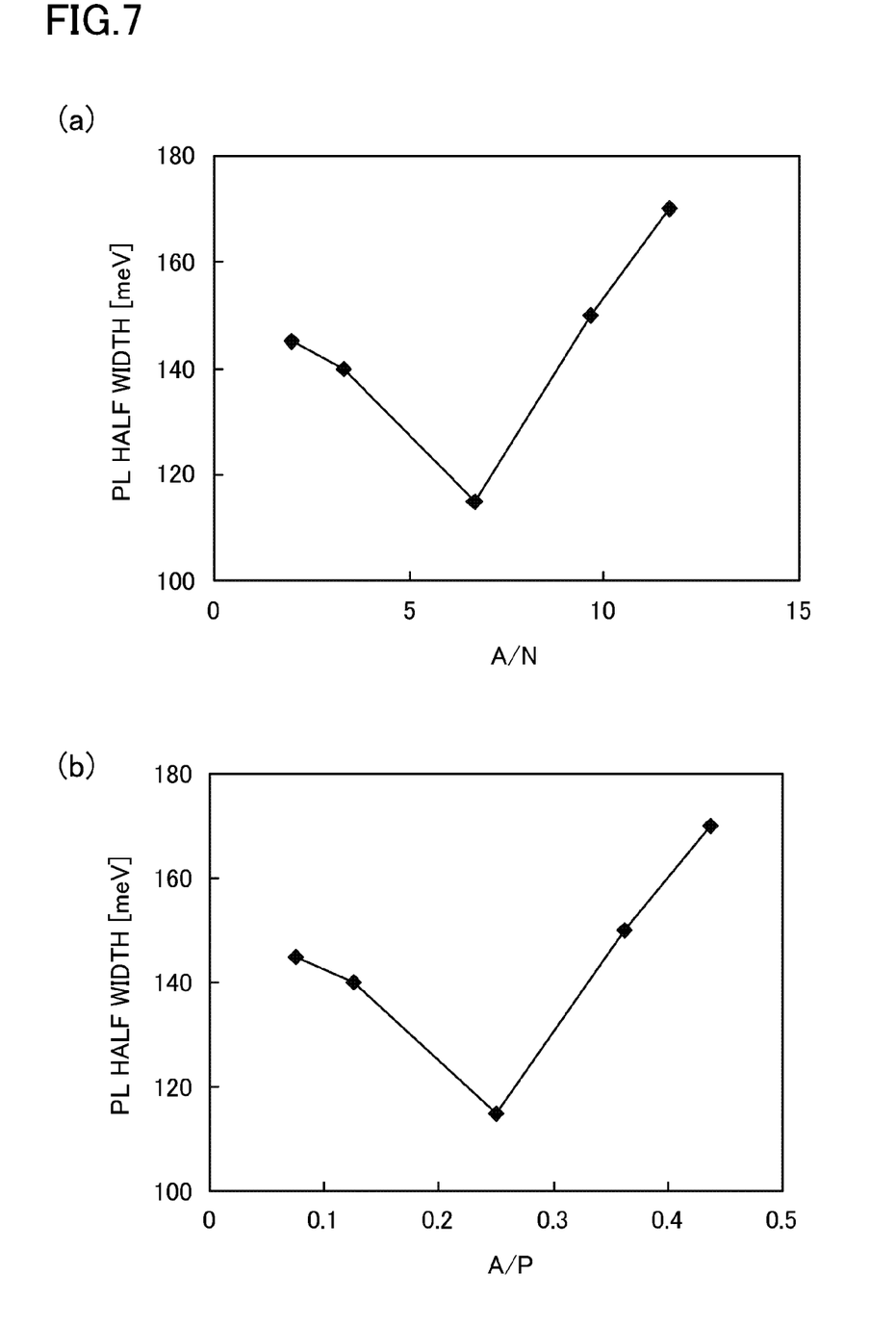
FIG. 7A is a graph showing the relationship between the photoluminescence half width and the ratio of the hydrogen concentration in the quantum well active layer to the hydrogen concentration in the n-type cladding layer.
FIG. 7B is a graph showing the relationship between the photoluminescence half width and the ratio of the hydrogen concentration in the quantum well active layer to the hydrogen concentration in the p-type cladding layer.

FIGS. 7A and 7B each show the relationship between the PL half width and the ratio between the hydrogen concentration in the active layer 105 and the hydrogen concentration in the n-type cladding layer 102 and the p-type cladding layer 109. As shown in FIG. 7A, as the ratio (A/N) between the hydrogen concentration in the active layer 105 and the hydrogen concentration in the n-type cladding layer 102 increases, the PL half width gradually decreases. The PL half width is at minimum when A/N is about 7, and the PL half width gradually increases as A/N increases. As shown in FIG. 7B, as the ratio (A/P) between the hydrogen concentration in the active layer 105 and the hydrogen concentration in the p-type cladding layer 109 increases, the PL half width gradually decreases. The PL half width is at minimum when A/P is about 0.25, and the PL half width gradually increases as A/P increases. The PL half width can be made smaller than about 150 meV by setting A/N to be greater than 2 and less than 10 while setting A/P to be greater than 0.07 and less than 0.35. That is, the PL half width can be made smaller than about 150 meV by setting the hydrogen concentration in the active layer to be greater than twice and less than 10 times the hydrogen concentration in the n-type cladding layer and to be greater than 0.07 time and less than 0.35 time the hydrogen concentration in the p-type cladding layer. Particularly, the PL half width can be made less than or equal to about 120 meV by setting A/N to be 5.9 or more and 7.2 or less while setting A/P to be 0.22 or more and 2.7 or less.

A reason why the hydrogen concentration in the p-type cladding layer 109 is greater than that in the active layer 105 is that Mg which is a p-type impurity is added when growing the p-type cladding layer 109. Since Mg easily binds with hydrogen, the hydrogen concentration in the Mg-containing p-type cladding layer 109 is greater than the active layer 105.

Figure 8:
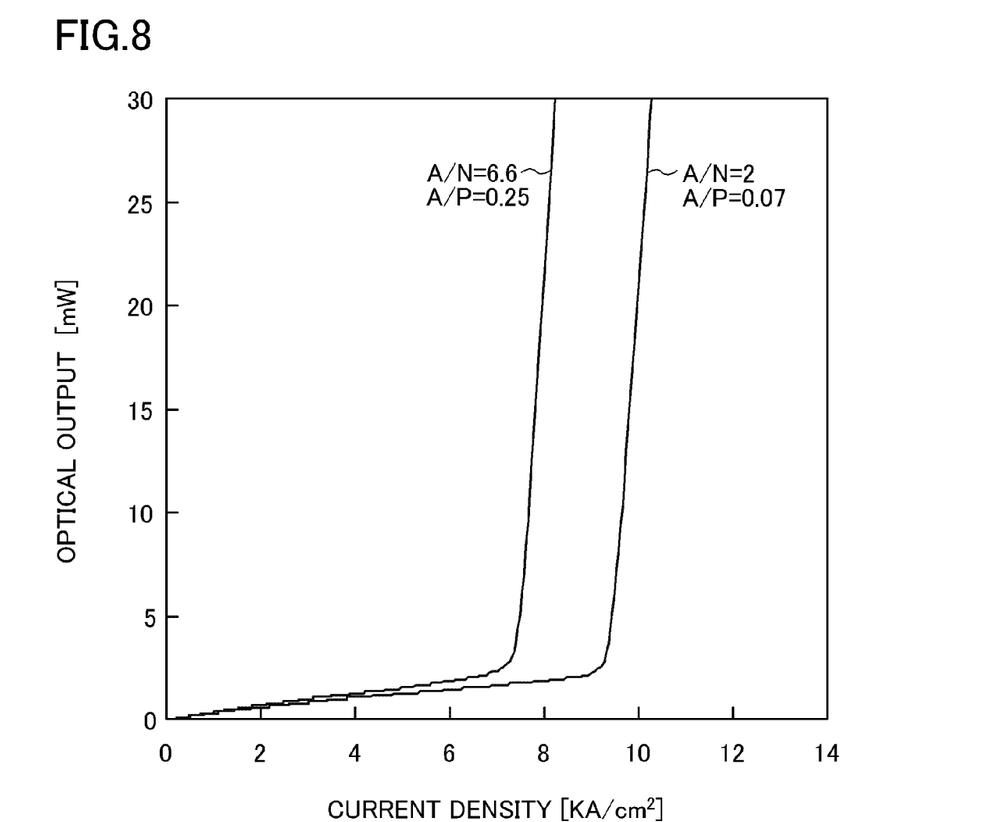
FIG. 8 is a graph showing the relationship between the current density and the optical output.
Figure 9:
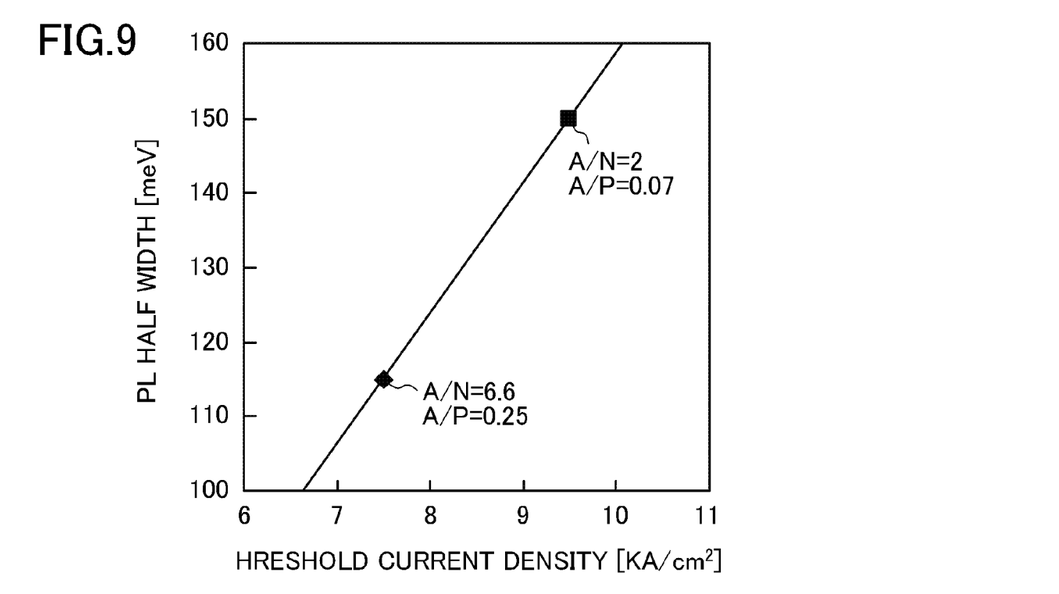
FIG. 9 is a graph showing the relationship between the threshold current density and the photoluminescence half width.

FIG. 8 shows the relationship between the current density and the optical output. Where A/N was 6.6 and A/P was 0.25, the threshold current density at which laser oscillation occurs was about 7.5 KA/cm$^2$. On the other hand, where A/N was 2 and A/P was 0.07, the threshold current density increased to about 9.4 KA/cm$^2$. FIG. 9 shows the relationship between the threshold current density and the PL half width. When the threshold current density is small, the PL half width is also small.

While the present embodiment has been directed to an example where the well layer is InGaN, the well layer may contain aluminum (Al), boron (B), phosphorus (P), arsenic (As), zinc (Zn), or the like, instead of or in addition to indium.

In the present embodiment, while the substrate is a GaN substrate whose principal plane is the (0001) plane, it may be a GaN substrate whose principal plane is a (10-1x) plane, a (11-2x) plane (where x is an integer greater than zero), or the like. A sapphire substrate, a silicon carbide (SiC) substrate, a silicon (Si) substrate, a zinc oxide (ZnO) substrate or a spinel substrate may be used instead of the GaN substrate. The composition, the thickness, etc., of each layer shown in the embodiment are merely illustrative, and may be changed as necessary.

Figure 10:
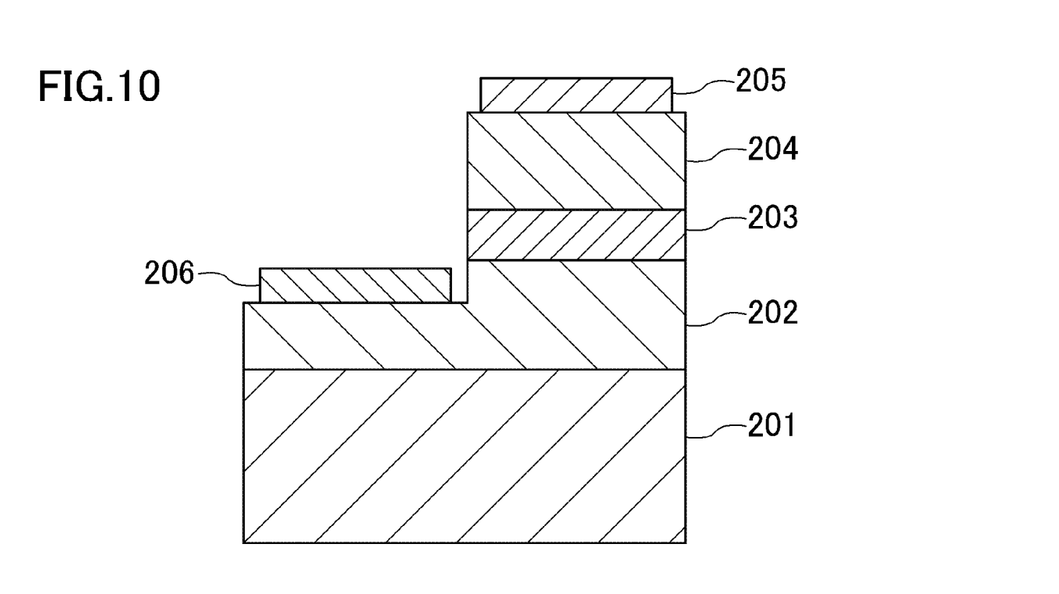
FIG. 10 is a cross-sectional view showing a variation of the nitride semiconductor light-emitting device according to one embodiment.

While the present embodiment has been directed to a semiconductor laser device having a ridge-shaped optical waveguide, similar advantages are obtained also with a buried-type laser device. The present invention is not limited to semiconductor laser devices but may be applied to super luminescence diodes, etc. Moreover, the present invention may be applied to semiconductor light-emitting diodes (LEDs), and may employ such a configuration as shown in FIG. 10, for example, in such a case. An n-type contact layer 202 made of n-GaN, an InGaN quantum well active layer 203, and a p-type contact layer 204 made of p-GaN are formed in this order on a substrate 201. A p-type electrode 205 is formed on the p-type contact layer 204, and an n-type electrode 206 is formed on the n-type contact layer 202. Also with such a configuration, indium segregation is suppressed, and the internal quantum yield of the quantum well active layer is therefore very high. The indium content non-uniformity is also suppressed, and it is therefore possible to narrow the PL half width to about 110 meV to about 120 meV. With these, it is possible to increase the light-emitting efficiency of an LED.

As described above, a nitride semiconductor light-emitting device of the present disclosure and a method for manufacturing the same are useful particularly as a nitride semiconductor laser device, a method for manufacturing the same, etc., because it is possible to suppress indium segregation and indium content non-uniformity in the active layer and to thereby realize a nitride semiconductor light-emitting device having a low threshold current density.

What is claimed is:

1. A semiconductor light-emitting device, comprising:
an n-type cladding layer formed on a substrate;
an active layer formed on the n-type cladding layer and including a well layer and a barrier layer; and
a p-type cladding layer formed on the active layer, wherein
the well layer is made of an indium-containing nitride semiconductor, and has a hydrogen concentration greater than that of the n-type cladding layer and less than that of the p-type cladding layer.

2. The semiconductor light-emitting device of claim 1, wherein
the hydrogen concentration of the well layer is greater than twice and less than approximately 10 times the hydrogen concentration of the n-type cladding layer and is greater than approximately 0.07 time and less than approximately 0.35 time the hydrogen concentration of the p-type cladding layer.

3. The semiconductor light-emitting device of claim 1, wherein
the hydrogen concentration of the well layer is greater than approximately $7 \times 10^{17}$ cm$^{-3}$ and less than approximately $3 \times 10^{18}$ cm$^{-3}$.

4. The semiconductor light-emitting device of claim 1, wherein
the well layer and the barrier layer have an equal hydrogen concentration.

5. The semiconductor light-emitting device of claim 1, wherein
the well layer is made of a compound whose general formula is expressed as In$_x$Ga$_{1-x}$N (where 0<x<1).

6. The semiconductor light-emitting device of claim 5, wherein
an indium content ratio of the well layer is approximately 0.1 or more.

7. The semiconductor light-emitting device of claim 1, wherein
an indium segregation density of the active layer is approximately $1 \times 10^6$ cm$^{-2}$ or less.

8. The semiconductor light-emitting device of claim 1, wherein
a photoluminescence half width of the active layer is approximately 120 meV or less.

9. A method for manufacturing a semiconductor light-emitting device, comprising the steps of:
(a) growing an n-type cladding layer on a substrate;

(b) after the step (a), growing an active layer using a hydrogen-containing carrier gas; and (c) after the step (b), growing a p-type cladding layer, wherein the active layer includes a well layer and a barrier layer, and the well layer is made of an indium-containing nitride semiconductor, and has a hydrogen concentration greater than that of the n-type cladding layer and less than that of the p-type cladding layer.

10. The method for manufacturing a semiconductor light-emitting device of claim 9, wherein the step (b) is performed so that the hydrogen concentration of the well layer is greater than twice and less than approximately 10 times the hydrogen concentration of the n-type cladding layer and is greater than approximately 0.07 time and less than approximately 0.35 time the hydrogen concentration of the p-type cladding layer.

11. The method for manufacturing a semiconductor light-emitting device of claim 9, wherein the step (b) is performed so that the hydrogen concentration of the well layer is greater than approximately $7 \times 10^{17}$ $cm^{-3}$ and less than approximately $3 \times 10^{18}$ $cm^{-3}$.

12. The method for manufacturing a semiconductor light-emitting device of claim 9, wherein the step (b) is performed so that the hydrogen concentration of the well layer and the hydrogen concentration of the barrier layer are equal to each other.

13. The method for manufacturing a semiconductor light-emitting device of claim 9, wherein the well layer is made of a compound whose general formula is expressed as $In_xGa_{1-x}N$ (where $0<x<1$).

14. The method for manufacturing a semiconductor light-emitting device of claim 13, wherein an indium content ratio of the well layer is approximately 0.1 or more.

15. The method for manufacturing a semiconductor light-emitting device of claim 9, wherein an indium segregation density of the active layer is approximately $1 \times 10^6$ $cm^{-2}$ or less.

16. The method for manufacturing a semiconductor light-emitting device of claim 9, wherein a photoluminescence half width of the active layer is approximately 120 meV or less.

* * * * *